United States Patent
Subramanian et al.

(10) Patent No.: US 6,589,711 B1
(45) Date of Patent: Jul. 8, 2003

(54) DUAL INLAID PROCESS USING A BILAYER RESIST

(75) Inventors: Ramkumar Subramanian, Sunnyvale, CA (US); Christopher F. Lyons, Fremont, CA (US); Marina V. Plat, San Jose, CA (US); Bhanwar Singh, Morgan Hill, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 21 days.

(21) Appl. No.: 09/824,696

(22) Filed: Apr. 4, 2001

(51) Int. Cl.$^7$ ........................ H01L 21/4763; G03F 7/00
(52) U.S. Cl. ................. 430/311; 430/312; 430/313; 430/314; 430/322; 438/636
(58) Field of Search ................. 430/312, 313, 430/314, 322, 394; 438/636

(56) References Cited

U.S. PATENT DOCUMENTS

| | | | |
|---|---|---|---|
| 4,316,946 A | 2/1982 | Masters et al. | 430/9 |
| 5,204,226 A | 4/1993 | Baier et al. | 430/326 |
| 5,393,702 A | 2/1995 | Yang et al. | 437/195 |
| 5,432,073 A | 7/1995 | Wu et al. | 438/624 |
| 5,547,808 A * | 8/1996 | Watanabe | 430/313 |
| 5,643,407 A | 7/1997 | Chang | 438/623 |
| 5,814,186 A | 9/1998 | Nguyen | 438/703 |
| 5,866,306 A | 2/1999 | Miller et al. | 430/326 |
| 5,883,006 A * | 3/1999 | Iba | 438/712 |
| 5,989,776 A | 11/1999 | Felter et al. | 430/270.1 |
| 6,013,579 A | 1/2000 | Wang et al. | 438/692 |
| 6,025,116 A * | 2/2000 | Grassmann | 430/313 |
| 6,043,147 A | 3/2000 | Chen et al. | 438/624 |
| 6,046,104 A | 4/2000 | Kepler | 438/637 |
| 6,054,769 A | 4/2000 | Jeng | 257/758 |
| 6,074,943 A * | 6/2000 | Brennan et al. | 438/636 |
| 6,080,526 A | 6/2000 | Yang et al. | 430/296 |
| 6,083,851 A | 7/2000 | Shields et al. | 438/776 |
| 6,093,966 A | 7/2000 | Venkatraman et al. | 257/751 |
| 6,103,456 A | 8/2000 | Többen et al. | 430/317 |
| 6,124,640 A | 9/2000 | Sahota et al. | 257/758 |
| 6,140,226 A | 10/2000 | Grill et al. | 438/637 |
| 6,150,256 A | 11/2000 | Furukawa et al. | 438/618 |
| 6,165,898 A * | 12/2000 | Jang et al. | 438/638 |
| 6,204,168 B1 | 3/2001 | Naik et al. | 438/638 |
| 6,207,554 B1 * | 3/2001 | Xu et al. | 438/624 |
| 6,261,937 B1 | 7/2001 | Többen et al. | 438/601 |
| 6,268,457 B1 * | 7/2001 | Kennedy et al. | 106/287.13 |
| 6,309,955 B1 * | 10/2001 | Subramanian et al. | 438/618 |

OTHER PUBLICATIONS

"Silicon Processign for the VLSI Era," Lithography I: Optical Resist Materials and Process Technology, pp. 423–428.
R. DeJule, "Dual–Damascene: Overcoming Process Issues", Semiconductor International, pp. 1–18, Cahners.

* cited by examiner

Primary Examiner—Mark F. Huff
Assistant Examiner—Kripa Sagar
(74) Attorney, Agent, or Firm—Foley & Lardner

(57) ABSTRACT

There is provided a method of making a dual inlaid via in a first layer. The first layer may be a polymer intermetal dielectric, such as HSQ, of a semiconductor device. The method includes forming a first opening, such as a via, in the first layer and forming a bilayer resist in the first opening. The bilayer resist includes an imaging layer above a bottom antireflective coating (BARC). The imaging layer is selectively exposed to radiation such that no radiation reaches the lower section of the BARC in the first opening through the upper section of the BARC. The bilayer resist is patterned, and a second opening, such as a trench, is formed in communication with the first opening using the patterned bilayer resist as a mask.

30 Claims, 6 Drawing Sheets

DUAL INLAID PROCESS USING A BILAYER RESIST

This application is related to commonly assigned application titled "Dual Inlaid Process Using an Imaging Layer To Protect Via From Poisoning " Ser. No. 09/824,662, filed on the same date as the present application.

BACKGROUND OF THE INVENTION

This invention is related generally a method of making a semiconductor device and specifically to a dual damascene process using a bilayer resist.

In order to increase the miniaturization of semiconductor devices, contacts between conductive layers in a semiconductor device are formed by the dual damascene process which utilizes a dual inlaid via. It has recently been suggested in the article titled "*DUAL DAMASCENE: OVERCOMING PROCESS ISSUES*" by Ruth DeJule in the June 2000 issue of *SEMICONDUCTOR INTERNATIONAL* to use a bilayer resist to form a dual inlaid via for a dual damascene process. An example of the "via first " dual damascene process using a bilayer resist, similar to the one described in the DeJule article, is illustrated in FIGS. 1A–F.

FIG. 1A illustrates a portion of an in process metallization section 1 of a semiconductor device. The metallization section contains a first conductive layer 3 and an insulating layer 5 formed over the first conductive layer 3. The conductive layer 3 may be a metal interconnect, such as an aluminum interconnect. The insulating layer 5 contains a narrow via 7 which extends from the top surface 9 of the insulating layer 7 to the first conductive layer 3. The via 7 has a circular cross section and contains only one sidewall 11 having a circular perimeter.

A conventional, bilayer resist film 12, is formed in the via 7 and over the upper surface 9 of the insulating layer 5, as shown in FIG. 1B. The bilayer resist 12 includes a bottom antireflection coating ("BARC") 13 and a top imaging layer 14. The BARC 13 is typically a water soluble organic fluoropolymer which absorbs rather than reflects a majority of the exposing radiation. The top imaging layer 14 is a silicon containing polymer, such as a silane polymer, that is sensitive to selective radiation exposure. As shown in FIG. 1B, the bilayer resist 12 has a thickness of 2,500 to 3,500 angstroms. However, the BARC 13 is relatively thin and does not extend far above the upper surface 9 of the insulating layer. For example, the BARC 13 extends less than about 100 angstroms above the upper surface 9 of the insulating layer, creating a dip or recess 10 above the via 7. A small portion of the imaging layer 14 is present in the recess 10 in the BARC 13 above the top portion of the via 7.

The bilayer resist 12 is selectively exposed to radiation through a conventional lithographic mask or reticule (not shown), as illustrated in FIG. 1C. During the exposure, a first portion 15 of the imaging layer 14 over the upper surface 9 of the insulating layer 5 directly adjacent to via 7 sidewall 11 and a second portion 17 of the imaging layer 14 above the via 7 are exposed, as indicated by the cross hatching in FIG. 1C. A third portion 19 of the imaging layer 14 over the upper surface 9 of the insulating layer 5 distal from the via sidewall 11, is shielded by the mask and is not exposed to radiation. The exposed positive imaging layer 14 is then developed and patterned to remove the exposed first and second portions 15, 17 while leaving the third portion 19 of the imaging layer 14 on the BARC 13 as a mask.

The exposed first portion 15A of the BARC 13 above the upper surface of the insulating layer 5 and a second portion 17A of the BARC 13 in the via 7 are removed by selective etching, such as by oxygen plasma etching, as illustrated in FIG. 1D. The third portion 19A of the BARC 13 that is masked by the third portion 19 of the imaging layer 14 is not removed because the imaging layer is not substantially removed by the oxygen plasma. The removal of the first and second portions 15A, 17A of the BARC 13 exposes a portion of upper surface 9 of the insulating layer 5.

The exposed portion of the insulating layer 5 is etched using the third portion 19/19A of the bilayer resist 12 as a mask to form a trench 21 having a width greater than that of the via 7. The remaining third portion 19/19A of the bilayer resist 12 is then removed by conventional methods, as illustrated in FIG. 1E. The top of the via 7 is located in a bottom surface 23 of the trench 21. In other words, the exposed portion of the insulating layer 5 is etched to remove a top section of the exposed portion of the insulating layer, without etching the bottom section of the exposed portion.

The dual damascene process is then completed by forming a second conductive layer 25, as illustrated in FIG. 1F. The second conductive layer 25 may be a metal layer which is formed in the trench 21, such that it extends through the via 7 to contact the first conductive layer 3. The second conductive layer is planarized by chemical mechanical polishing or etch back such that its top surface is even with the upper surface 9 of the insulating layer 5.

However, the prior art dual damascene process suffers from a problem of via poisoning. This problem is illustrated in FIG. 2. During the bilayer resist 12 exposure step illustrated in FIG. 1C, the second portion 17A of the BARC 13 binds to the via 7 sidewall 11 and forms a rigid mushroom shape, as shown in FIG. 2. The bound top section of the second portion 17A is schematically illustrated by double cross hatches. Therefore, the second portion 17A of the BARC 13 cannot be removed or fully removed from the via 7 during subsequent oxygen plasma etching step because it is chemically and/or physically bound to the via sidewall 11. Thus, the second conductive layer 25 cannot contact or fully contact the first conductive layer 3 through the via 7, because the via 7 is filled by the second portion 17A of the BARC 13 which is rigidly bound to the via 7 sidewall 11. This causes an open circuit between the first and second conductive layers or a poorly conductive path there between, which leads to device failure. This poison via problem is especially severe when the insulating layer 5 is a low-k (i.e., a low dielectric constant) polymer material, such as hydrogensilsesquioxane (HSQ).

BRIEF SUMMARY OF THE INVENTION

According to one aspect of the present invention, there is provided a method of making a dual inlaid via in a first layer, comprising forming a first opening in the first layer, forming a bilayer resist comprising an imaging layer above a BARC in the first opening, such that a lower section of the BARC is located in the first opening and an upper section of the BARC extends above the first opening, selectively exposing the imaging layer to radiation, patterning the bilayer resist, forming a second opening in communication with the first opening using the patterned bilayer resist as a mask, and wherein said bilayer resist forming step includes forming the BARC such that said upper section of the BARC extends above the first opening to a first height that is sufficient to substantially prevent exposing radiation from reaching a lower section of the BARC located in the first opening.

According to another aspect of the present invention, there is provided a method of making a semiconductor device containing a dual damascene contact, comprising forming a via in a polymer containing insulating layer, forming a bilayer resist comprising an imaging layer above a BARC in the via, such that a lower section of the BARC is located in said via and an upper section of the BARC extends above the via, selectively exposing the imaging layer to radiation and patterning the exposed imaging layer to remove a first portion of the imaging layer above the upper surface of the insulating layer adjacent to via sidewall and a second portion of the imaging layer over the via, while leaving a third portion of the imaging layer over the upper surface of the insulating layer distal from the via sidewall. The method further comprises removing a first portion of the BARC above the upper surface of the insulating layer adjacent to the via sidewall and a second portion of the BARC in the via, while leaving a third portion of the BARC that is masked by the third portion of the imaging layer on the upper surface of the insulating layer distal from the via sidewall and etching an exposed upper portion of the insulating layer using the third portion of the imaging layer and the third portion of the BARC as a mask to form a trench having a width greater than that of the via, such that a top of the via is located in a bottom surface of the trench. The bilayer resist forming step includes forming the BARC such that said upper section of the BARC extends above the via to a first height that is sufficient to substantially prevent exposing radiation from reaching a lower section of the BARC located in the via According to another aspect of the present invention, there is provided a method of making a semiconductor device containing a dual damascene contact, comprising forming an active element over a substrate, forming a first conductive layer over the active element, forming an insulating layer comprising hydrogensilsesquioxane over the first conductive layer and forming a first resist over the insulating layer. The method further comprises selectively exposing the first resist to radiation, patterning the first resist, etching the insulating layer using the patterned first resist as a mask to form a via extending through the insulating layer to the first conductive layer and removing the first resist. The method further comprises forming a bilayer resist comprising an imaging layer above a BARC in the via, such that a lower section of the BARC is located in said via and an upper section of the BARC extends above the via, selectively exposing the imaging layer to radiation and patterning the exposed imaging layer to remove a first portion of the imaging layer above the upper surface of the insulating layer adjacent to via sidewall and a second portion of the imaging layer over the via, while leaving a third portion of the imaging layer on the BARC over the upper surface of the insulating layer distal from the via sidewall. The method further comprises removing a first portion of the BARC above the upper surface of the insulating layer adjacent to the via sidewall and a second portion of the BARC in the via, while leaving a third portion of the BARC that is masked by the third portion of the imaging layer on the upper surface of the insulating layer distal from the via sidewall and etching an exposed upper portion of the insulating layer using the third portion of the imaging layer and the third portion of the BARC as a mask to form a trench having a width greater than that of the via, such that a top of the via is located in a bottom surface of the trench. The method further comprises forming a second conductive layer in the trench such that the second conductive layer contacts the first conductive layer through the via and planarizing the second conductive layer such that a top surface of the second conductive layer is substantially level with the upper surface of the insulating layer. The bilayer resist forming step includes forming the BARC such that said upper section of the BARC extends above the via to a first height that is sufficient to substantially prevent exposing radiation from reaching a lower section of the BARC located in the via.

DETAILED DESCRIPTION OF THE PREFERRED EMBODIMENTS

Figure 1A:
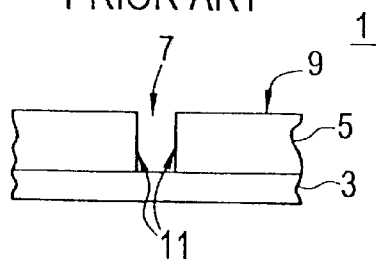
FIGS. 1A–F illustrate a side cross sectional view of a prior art dual damascene process.
Figure 1D:
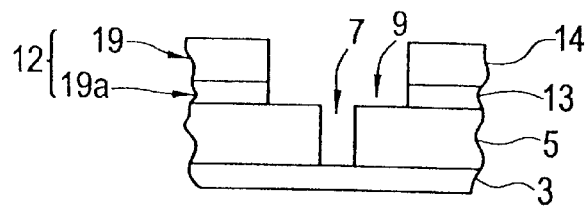
Figure 1B:
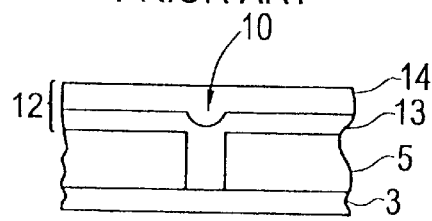
Figure 1E:
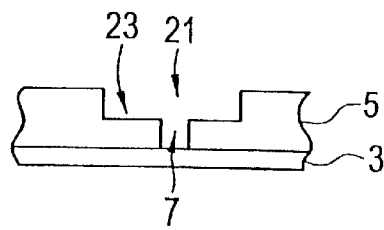
Figure 1C:
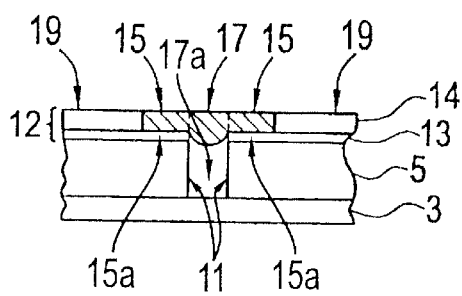
Figure 1F:
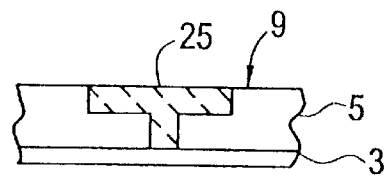
Figure 2:
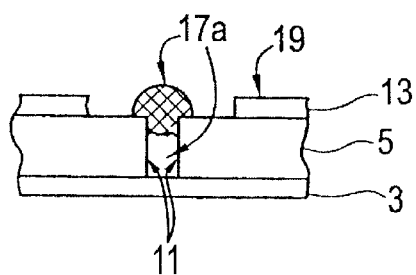
FIG. 2 illustrates the formation of a rigid mushroom shape in the prior art process.

The present inventors have realized that the poison via problem of the prior art dual damascene process occurs because the organic (i.e., carbon based or carbon backbone containing) BARC forms a chemical bond with the etched sidewall(s) of an opening in an insulating layer. The chemical bonding is especially strong when the insulating layer is a low-k polymeric material, such as HSQ. Therefore, the chemical bonding between the BARC and the opening sidewall(s) prevents removal of the photoresist from the opening. This problem is exacerbated in the "via first" dual inlaid via process, since the BARC is located in a very narrow via, which has a low volume but a high sidewall surface area, and almost the entire volume of the BARC in the via contacts and is bound to the via sidewall(s). Thus, it is especially difficult to remove the carbon based BARC from a narrow via.

While not wishing to be bound to any particular theory of operation, the present inventors believe that the bonding between the BARC and the opening (i.e., via) sidewall occurs by the following mechanism. When the via is etched using a plasma etching method, the via sidewall is damaged by the etching step. The damage may include dangling bonds on the via sidewall and etching gas impurities, such as nitrogen and/or carbon, bound to the via sidewall. This via sidewall damage is particularly severe in low-k dielectrics, such as HSQ. In contrast, the unetched top surface of the insulating layer is not damaged because it is masked during etching. The present inventors believe that the dangling bonds and/or impurities bound to the via sidewall chemically bind to the carbon based BARC. The present inventors also believe that the exposing radiation which is used to expose the imaging layer of the bilayer resist penetrates into the BARC located in the via and provides the energy which causes the carbon based BARC to bind to the damaged via sidewall. Therefore, since the prior art BARC described with respect to FIGS. 1A–F and 2 is relatively thin, this allows the exposing radiation to reach the portion of the BARC adjacent to the via sidewall, causing the BARC to bind to the sidewall. Thus, the present inventors have determined that the undesirable prior art mushroom shape formed in the via is the result of insufficient BARC thickness above the via. This allows a portion of the exposing radiation to either directly reach the BARC located in the via or allows the radiation to penetrate through a thin BARC section above the via to the section of the BARC located in the via and/or adjacent to the via sidewall. While the inventors believe that the bonding occurs by this mechanism, the present invention should not be considered to be limited by this bonding mechanism.

The present inventors have realized that if the BARC of a bilayer resist is formed with a sufficient thickness above the via to prevent substantially all or all exposing radiation from reaching the portion of the BARC located in the via, then the BARC would not bind to the damaged sidewall of the opening (i.e., via or trench) or would bind to the sidewall to a lesser degree. Thus, such a BARC would be easier to remove from the via and the via blockage illustrated in FIG. 2 could be reduced or avoided. This would decrease the amount of open circuits between the conductive layers of a semiconductor device.

Thus, any bilayer resist may be used to fill the opening during a dual inlaid via process, according to the preferred embodiments of the present invention. In one aspect of the present invention, bilayer resist comprises a top, silicon containing imaging layer, and a bottom BARC. For example, such bilayer resists are available from Arch Chemicals under the names OiR620, OiR906, OiR908.

In a preferred aspect of the present invention, the silicon containing imaging layer comprises a polysilane or a polysiloxane imaging layer. Most preferably, the imaging layer comprises a polysilane polymer imaging layer. For example, the polysilane polymer layer may comprise polybisalkyl silane, polymethylphenyl silane or polyalkylphenyl silane. The BARC may be any carbon based polymer, such as a fluoropolymer, which absorbs rather than transmits or reflects the majority of radiation used to selectively expose the imaging layer. The BARC has a first thickness, such that an upper section of the BARC extends above the opening (i.e., via or trench) to a first height that is sufficient to substantially or even completely prevent the radiation that is used to expose the imaging layer from reaching the lower section of the BARC located in the opening. Exemplary BARC layers made by the Clariant Corporation for dual damascene processing include the AZ KrF-17B-80 coating for deep UV processing, the AZ ArF-2P coating for 193 nm exposing radiation and the AZ HERB™ coating for i-line processing.

The imaging layer preferably has a thickness of 400 to 2,000 angstroms, most preferably 400 to 800 angstroms. The BARC thickness depends on the opening (i.e., trench or via) depth. Preferably, the BARC has sufficient thickness to extend at least 100 angstroms above the top of the opening, more preferably at least 300 angstroms above the opening, more preferably at least 500 angstroms above the opening, most preferably 700 to 1500 angstroms above the opening. In certain embodiments, the BARC layer preferably has a thickness of 600 to 3000 angstroms, most preferably 1000 to 1500 angstroms depending on the opening depth and width (to ensure complete opening filling by the BARC). Thus, the bilayer resist preferably has a thickness of 800 to 5000 angstroms, more preferably 3000 to 4000 angstroms.

In a preferred aspect of the present invention the insulating layer which contains the opening, such as the via and/or trench, comprises a low-k dielectric layer having a dielectric constant of 3.7 or less, preferably 3.5 or less, most preferably 3.0 or less. In one preferred aspect of the present invention, the low-k insulating layer comprises a polymer containing a backbone which contains silicon. For example, the insulating layer may comprise at least one polymer selected from hydrogensiloxanes which have the formula $[(HSiO_{1.5})_x O_y]_n$, hydrogensilsesquioxanes which have the formula $(HSiO_{1.5})_n$, and hydroorganosiloxanes which have the formulas $[(HSiO_{1.5})_x O_y (RSiO_{1.5})_z]_n$ or $[(HSiO_{1.5})_x (RSiO_{1.5})_y]_n$, where x=6 to 20, y=1 to 3, z=6 to 20, n=1 to 4,000, and each R is independently H, $C_1$ to $C_8$ alkyl or $C_6$ to $C_{12}$ aryl. The most preferred material for the insulating layer is hydrogensilsesquioxane (HSQ).

However, the insulating layer may comprise other polymer type materials, such as organic spin-on glass, polysilsequioxane, siloxane parylene, PTFE, polyimide, fluorinated polyimide, benzocyclobutene, fluorinated benzocyclobutene, polyarylene ether or fluorinated polyarylene ether. For example, one such material is a nonfluorinated poly(arylether) available under the tradename FLARE™ from AlliedSignal Inc. Furthermore, the dual inlaid via may be formed in a conductive layer (i.e., metal, metal compound or doped polysilicon) or a semiconductor layer (i.e., silicon, SiC, III–V or II–VI) layers, rather than in an insulating layer, if it is desired to form a dual inlaid via in such a layer.

Figure 3A:
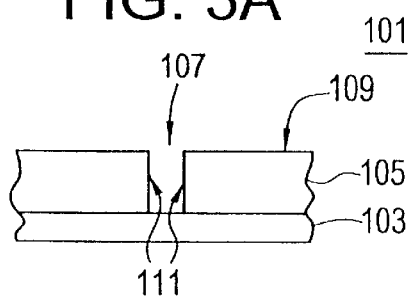
FIGS. 3A–F illustrate a side cross sectional view of a "via first" dual damascene process according to the first preferred embodiment of the present invention.

FIGS. 3A–F illustrate a first preferred embodiment of the present invention in which a dual inlaid via for a dual damascene process is formed by the "via first" patterning technique using the bilayer resist. FIG. 3A illustrates a portion of an in process metallization section 101 of a semiconductor device. The metallization section contains a first conductive layer 103. The conductive layer 103 may be a metal interconnect or electrode, such as an aluminum, copper, tungsten, titanium, or other conductive interconnect or electrode, such as titanium nitride or doped polysilicon. An insulating layer 105 is formed over the first conductive layer 103. Preferably, the insulating layer 105 comprises one or more sublayers of a low-k polymer dielectric described above, such as HSQ. Alternatively, the insulating layer may comprise one or more sublayers of inorganic or non-polymer dielectric materials, such as silicon oxide, silicon nitride, silicon oxynitride, fluorinated silicon oxide, PSG, BSG, BPSG and/or spin-on glass.

A narrow via 107 is formed in the insulating layer 105 which extends from the top surface 109 of the insulating layer 105 to the first conductive layer 103, as illustrated in FIG. 3A. The bottom surface of the via comprises an exposed portion of a top surface of the first conductive layer 103. Preferably, the via 107 has a circular cross section and contains only one sidewall 111 having a circular perimeter. However, the via may have a polygonal cross section and thus contain plural sidewalls. The via 107 may be formed by any patterning methods, such as by mask and etch photolithography. Preferably, the via 107 is formed by as follows. A bilayer resist or a conventional photoresist layer (not shown) is formed over the insulating layer 105. The resist layer is exposed to radiation through a first mask, and the exposed portions are then removed. For example, if a bilayer resist is used, the exposed portions of the top imaging layer are developed and removed, while the remaining portions of the imaging layer are used as a mask during the etching of the exposed BARC portions. The via 107 is then etched in the insulating layer 105 using the remaining, unexposed portions of the resist as a mask. The via is preferably dry etched using a plasma, but wet etching may also be used if desired. The remaining masking portions of the resist are then removed after the via is etched.

Figure 3B:
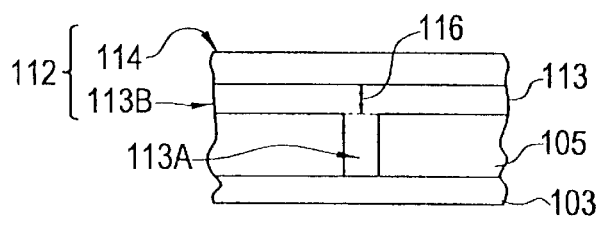

A bilayer resist 112, containing a BARC 113 and a top imaging layer 114, is formed in the via 107 and over the upper surface 109 of the insulating layer 105, as shown in FIG. 3B. The BARC 113 has a first section or height portion 113A that is located in, and completely fills, the via 107. The BARC also has a second section or height portion 113B which extends above the via 107 and above the upper surface 109 of layer 105. As described above, the thickness or height 116 of the second section 113B is sufficient to substantially or entirely block or prevent the exposing radiation from reaching the first section 113A of the BARC 113. The second section 113B extends at least 100 angstroms above the top of the via 107 (i.e., above the top of 113A), more preferably at least 300 angstroms above the top of the via 107, even more preferably at least 500 angstroms above the top of the via, most preferably 700 to 1500 angstroms above the top of the via.

Figure 3C:
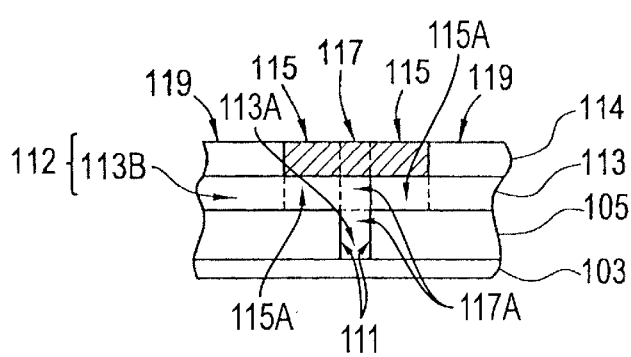

The bilayer resist 112 is then selectively exposed to radiation, such as light or UV radiation, through a lithographic mask or reticule (not shown), as illustrated in FIG. 3C. During the exposure, substantially or completely no exposing radiation reaches the first BARC section 113A in the via 107 through the second BARC section 113B above the via 107. The height 116 of the BARC effectively prevents the exposing radiation from reaching the BARC first section 113A so as to substantially prevent or reduce via poisoning as described in connection with FIG. 2.

Figure 3D:
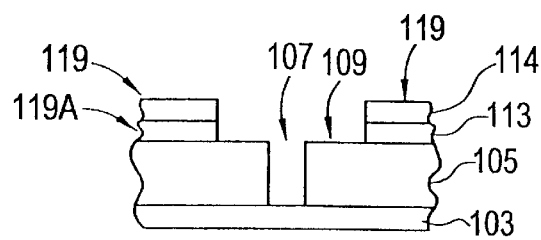

During the exposure, a first portion 115 of the imaging layer 114 over the upper surface 109 of the insulating layer 105 over and adjacent to via 107 sidewall 111 and a second portion 117 of the imaging layer 114 above the via 107 are exposed to radiation, as indicated by the cross hatching in FIG. 3C. A third portion 119 of the imaging layer 114 over the upper surface 109 of the insulating layer 105 distal from the via sidewall 111 is shielded by the lithographic mask and is not exposed to radiation. The exposed positive imaging layer 114 is then developed and patterned to remove the exposed first 115 and second 117 portions, while leaving the third portion 119 of the imaging layer 114 on the BARC 113 over the insulating layer 105 as a mask, as illustrated in FIG. 3D. For example, tetramethyl ammonium hydroxide (TMAH) may be used to develop and remove the exposed portions of the imaging layer 114.

An unprotected first portion 115A of the BARC 113 above the upper surface 109 of the insulating layer 105 and an unprotected second portion 117A of the BARC 113 in the via 107 are removed by selective etching, such as by oxygen plasma etching. The third portion 119A of the BARC 113 that is masked by the third portion 119 of the imaging layer 114 is not removed because the imaging layer is not substantially removed by the oxygen plasma. The removal of the first and second portions 115A, 117A of the BARC 113 exposes a portion of upper surface 109 of the insulating layer 105.

Figure 3E:
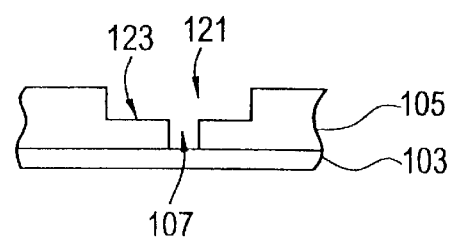

The unmasked upper surface 109 of the insulating layer 105 is then etched using the third portion 119/119A of the bilayer resist 112 as a mask, to form a trench 121 having a width greater than that of the via 107. The remaining third portion 119/119A of the bilayer resist 112 is then removed by conventional methods, such as ashing, to complete the dual inlaid via, as illustrated in FIG. 3E. The top of the via 107 is located in a bottom surface 123 of the trench 121. In other words, the exposed portion of the insulating layer 105 is etched to remove a top section, without etching the bottom section of the exposed portion.

Figure 3F:
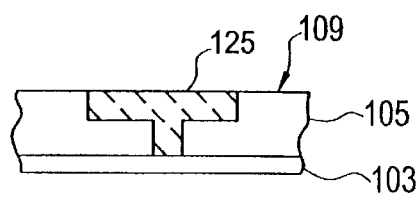

A second conductive layer 125 is then formed in the trench 121 and via 107, as illustrated in FIG. 3F. The second conductive layer 125 may be a metal layer, such as copper, aluminum, tungsten, titanium or another conductive layer such a titanium nitride. The second conductive layer 125 extends through the via 107 to contact the first conductive layer 103. If desired, the second conductive layer may be planarized by chemical mechanical polishing or etch back such that its top surface is even with the upper surface 109 of the insulating layer 105, to complete the dual damascene process. However, the second conductive layer 125 does not have to have to be planarized and may protrude above surface 109 if desired. Thus, the second portion 117A of the BARC 113 does not form the rigid mushroom shape of FIG. 2 and is thus easy to remove from the via 107. Therefore, the problem of via poisoning is reduced or eliminated by forming a BARC which extends above the via by a sufficient height or distance to block the exposing radiation from reaching the BARC section located in the via. The requisite energy required to initiate the photo assisted bonding between the damaged via sidewall 111 and the BARC section 113A in the via does not reach the BARC section 113A since the exposing radiation is blocked by the upper BARC section 113B.

Figure 4A:
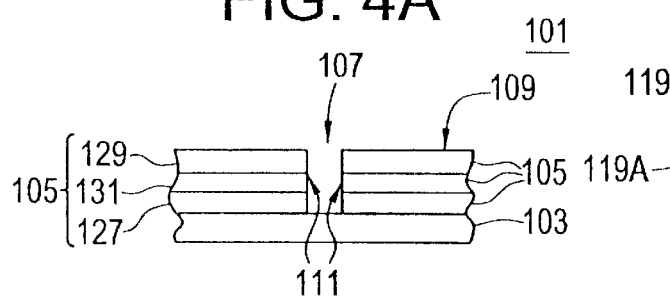
FIGS. 4A–F illustrate a side cross sectional view of a "via first" dual damascene process with an etch stop layer according to the second preferred embodiment of the present invention.
Figure 4D:
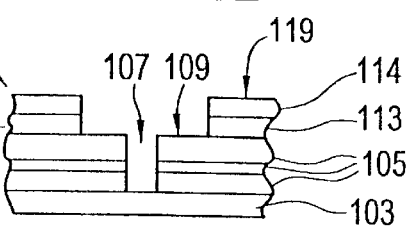
Figure 4B:
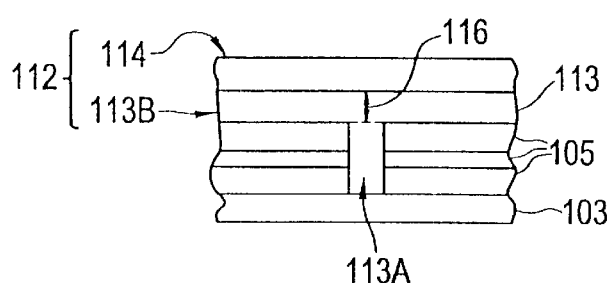

FIGS. 4A–F illustrate a second preferred embodiment of the present invention in which a dual inlaid via for a dual damascene process is formed by the "via first" patterning technique with an etch stop layer using the bilayer resist 112. This method is the same as the method described above with respect to FIGS. 3AF, except that the insulating layer 105 comprises three sublayers, 127, 129 and 131, as shown in FIG. 4A.

The first and second sublayers 127 and 129 are preferably low-k dielectric layers having a dielectric constant below 3.7, preferably below 3.5. For example sublayers 127 and 129 may comprise the same or different polymer sublayers, such as HSQ sublayers. The third sublayer 131 comprises an etch stop, which has a higher etch resistance than the first and second sublayers 127 and 129 to the etching medium used to etch the first and second sublayers 127 and 129. For example, the etch stop sublayer 131 is located between the first and second sublayers 127, 129, and comprises a material that is different from the materials of the first and second sublayers 127, 129. For example, sublayer 131 may comprise silicon nitride, silicon oxynitride, tantalum pentoxide and/or silicon oxide.

Figure 4E:
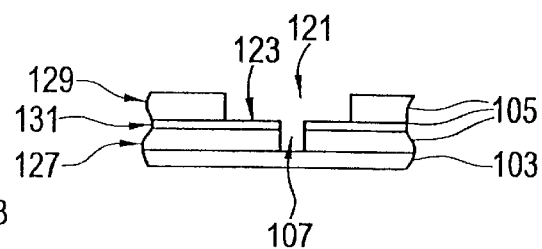
Figure 4C:
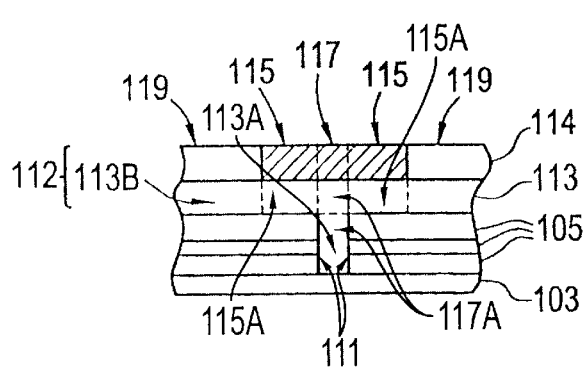
Figure 4F:
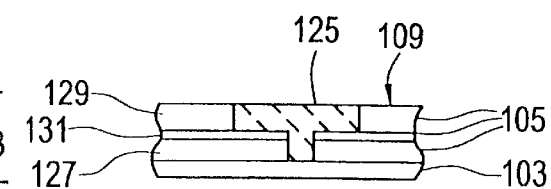

As shown in FIG. 4E, the step of etching the trench 121 automatically stops on the etch stop sublayer 131, since the etching medium used to selectively etch sublayer 129 substantially does not etch the material of sublayer 131. Thus, the via 107 is located in the first polymer sublayer 127 and the etch stop sublayer 131, and the trench 121 is located in the second polymer sublayer 129. The method of the second preferred embodiment is advantageous compared to the method of the first preferred embodiment because the trench etch automatically stops on the etch stop sublayer. Hence, a precise control of the timing of the trench etch of the first embodiment is not required. This provides improved control of the trench depth. Other elements and steps of the second preferred embodiment illustrated in FIGS. 4A–F are the same as in the method of the first embodiment shown in FIGS. 3A–3F and described above.

FIGS. 5A–5F illustrate a third preferred embodiment of the present invention in which a dual inlaid via for a dual damascene process is formed by the "trench first" patterning method. This technique differs from the "via first" method in that the trench is formed first, and then the via is formed in a bottom surface of the trench.

Figure 5A:
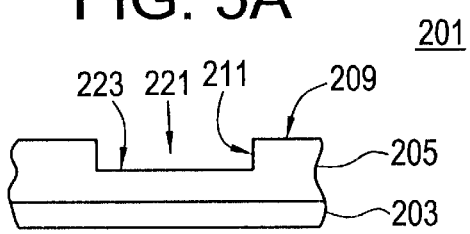
FIGS. 5A–F illustrate a side cross sectional view of a "trench first" dual damascene process according to the third preferred embodiment of the present invention.

FIG. 5A illustrates a portion of an in process metallization section 201 of a semiconductor device. The metallization section contains a first conductive layer 203. The conductive layer 203 may be a metal interconnect or electrode, such as an aluminum, copper, tungsten, titanium, or other conductive interconnect or electrode, such as titanium nitride. An insulating layer 205 is formed over the first conductive layer 203. Preferably, the insulating layer 205 comprises one or more sublayers of a low-k polymer dielectric described above, such as HSQ. Alternatively, the insulating layer may comprise one or more sublayers of inorganic or non-polymer dielectric materials, such as silicon oxide, silicon nitride, silicon oxynitride, fluorinated silicon oxide and/or spin-on glass.

A wide trench 221 is formed in the insulating layer 205. The trench 221 extends from the top surface 209 of the insulating layer 205 to a depth that is less than the thickness of the insulating layer 205. For example, the trench 221 depth may equal about 15% to 75%, preferably 25% to 65% of the thickness of the insulating layer 205. The thickness of the insulating layer is selected to provide the optimum insulating properties for a particular device. Preferably, the trench 221 has a circular cross section and contains only one sidewall 111 having a circular perimeter. However, the trench 221 may have a polygonal cross section and thus contain plural sidewalls. The trench 221 may be formed by any patterning methods, such as by mask and etch photolithography. Preferably, the trench 221 is formed by as follows. A bilayer resist or a conventional photoresist layer (not shown) is formed over the insulating layer 105. The resist layer is exposed to radiation through a first mask, and the exposed portions are then removed. For example, if a bilayer resist is used, the exposed portions of the top imaging layer are developed and removed, while the remaining portions of the imaging layer are used as a mask during the etching of the exposed BARC portions. The trench 221 is then etched in the insulating layer 105 using the remaining, unexposed portions of the resist as a mask. The trench is preferably dry etched using a plasma, but wet etching may also be used if desired. The remaining masking portions of the resist are then removed after the trench is etched.

Figure 5D:
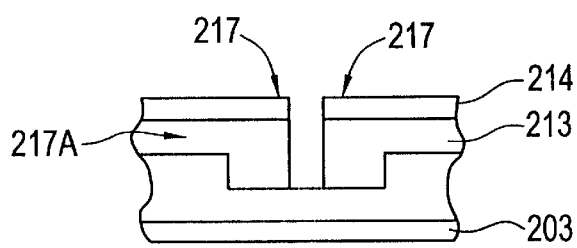
Figure 5B:
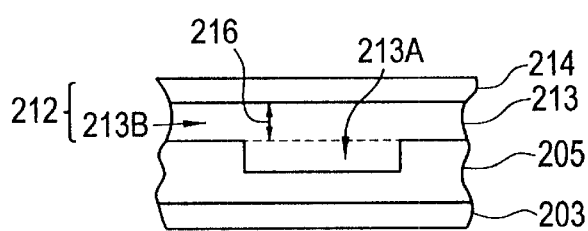

A bilayer resist 212, containing a BARC 213 and a top imaging layer 214, is formed in the trench 221 and over the upper surface 209 of the insulating layer 205, as shown in FIG. 5B. The BARC 213 has a first section or height portion 213A that is located in the trench 221. The BARC also has a second section or height portion 213B which extends above the trench 221 and above the upper surface 209 of layer 205. As described above, the thickness or height 216 of the second section 213B is sufficient to substantially or entirely block or prevent the exposing radiation from reaching the first section 213A of the BARC 213. The second section 213B extends at least 100 angstroms above the top of the trench 221 (i.e., above the top of 213A), more preferably at least 300 angstroms above the top of the trench 221, even more preferably at least 500 angstroms above the top of the trench 221, most preferably 700 to 1500 angstroms above the top of the trench 221.

Figure 5E:
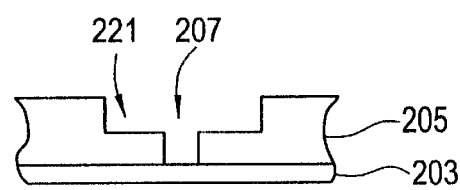
Figure 5C:
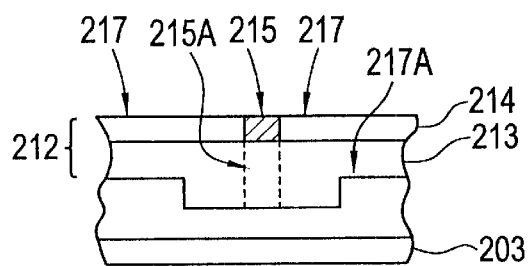

The bilayer resist 212 is then selectively exposed to radiation, such as light or UV radiation, through a lithographic mask or reticule (not shown), as illustrated in FIG. 5C. During the exposure, substantially or completely no exposing radiation reaches the first BARC section 213A in the trench 221 through the second BARC section 213B above the trench 221.

During the exposure, a first portion 215 of the imaging layer 214 over a central portion of the bottom surface 223 of the trench 221 is exposed to radiation, as indicated by the cross hatching in FIG. 5C. A second portion 217 of the imaging layer 214 over the peripheral portion of the trench 221, the sidewall 211 of the trench 221 and over the over the upper surface 209 of the insulating layer 205 is shielded by the lithographic mask and is not exposed to radiation. The exposed positive imaging layer 214 is then developed and patterned to remove the exposed first portion 215 to expose the BARC 213 over the central portion of the trench 221. The width of the first portion 215 of the imaging layer 214 is about the same as the desired width of the via to be formed in the bottom surface of the trench. The unexposed second portion 217 of the imaging layer 214 is left as a mask on the BARC 213 located over the insulating layer 205, the trench sidewall 211 and the peripheral portion of the bottom surface 223 of the trench 221.

An unprotected first portion 215A of the BARC 213 above the central portion of the trench 221 is removed by selective etching, such as by oxygen plasma etching as illustrated in FIG. 5D. The second portion 217A of the BARC 213 that is masked by the second portion 217 of the imaging layer 214 is not removed because the imaging layer is not substantially removed by the oxygen plasma. The removal of the first portion 215A of the BARC 213 exposes a central portion of the bottom surface 223 of the trench 221.

The uncovered portion of the bottom surface 223 of the trench 221 is then removed by etching using the second portion 217/217A of the bilayer resist 212 as a mask to form a via 207 extending to the first conductive layer 203. The remaining second portion,217/217A of the bilayer resist 212 is then removed by conventional methods, such as ashing, to complete the dual inlaid via, as illustrated in FIG. 5E. The top of the via 207 is thus located in a bottom surface 223 of the trench 221. The via 207 extends to a greater depth than the trench 221 and has a width less than that of the trench 221.

Figure 5F:
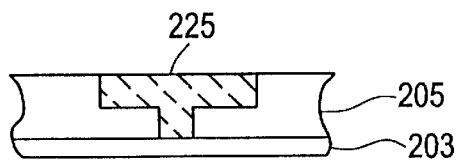

A second conductive layer 225 is then formed in the trench 221 and the via 207, as illustrated in FIG. 5F. The second conductive layer 225 may be a metal layer, such as copper, aluminum, tungsten, titanium or another conductive layer such a titanium nitride. The second conductive layer 225 extends through the via 207 to contact the first conductive layer 203. If desired, the second conductive layer may be planarized by chemical mechanical polishing or etch back such that its top surface is even with the upper surface 209 of the insulating layer 205, to complete the dual damascene process. However, the second conductive layer 225 does not have to have to be planarized and may protrude above surface 209 if desired.

Figure 6A:
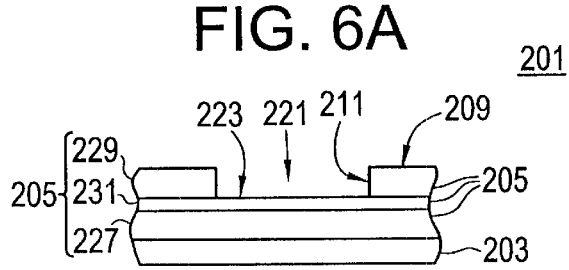
FIGS. 6A–F illustrate a side cross sectional view of a "trench first" dual damascene process with an etch stop layer according to the fourth preferred embodiment of the present invention.
Figure 6D:
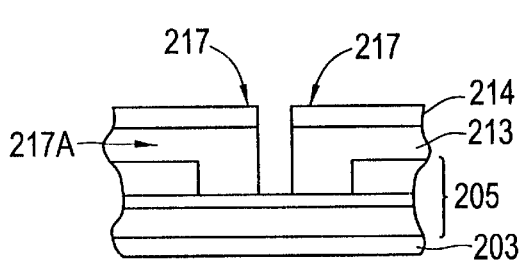
Figure 6B:
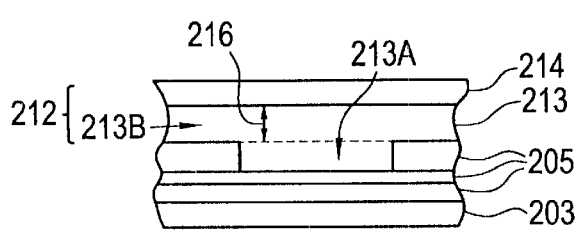
Figure 6E:
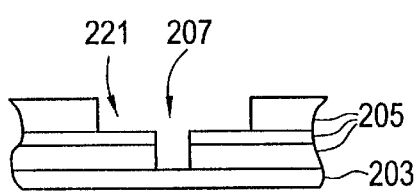
Figure 6C:
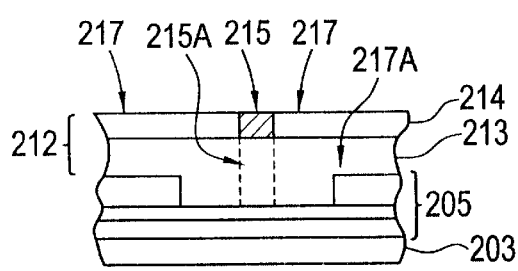
Figure 6F:
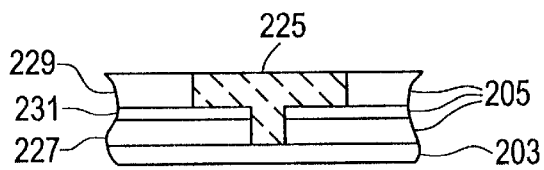

FIGS. 6A–F illustrate a fourth preferred embodiment of the present invention in which a dual inlaid via for a dual damascene process is formed by the "trench first" patterning method using the inorganic base radiation sensitive layer and an etch stop layer. This method is the same as the method described above with respect to FIGS. 5A–F, except that the insulating layer 205 comprises three sublayers, 227, 229 and 231, as shown in FIG. 6A.

The first and second sublayers 227 and 229 are preferably low-k dielectric layers having a dielectric constant below 3.7, preferably below 3.5. For example sublayers 227 and 229 may comprise the same or different polymer sublayers, such as HSQ sublayers. The third sublayer 231 comprises an etch stop, which has a higher etch resistance than the first and second sublayers 227 and 229 to the etching medium used to etch the first and second sublayers 227 and 229. For example, the etch stop sublayer 231 is located between the first and second sublayers 227, 229, and comprises a material that is different from the materials of the first and second sublayers 227, 229. For example, sublayer 231 may comprise silicon nitride, silicon oxynitride, tantalum pentoxide and/or silicon oxide.

As shown in FIG. 6A, the step of etching the trench 221 automatically stops on the etch stop sublayer 231, since the etching medium used to selectively etch sublayer 229 substantially does not etch the material of sublayer 231. The step of etching the via 207 in FIG. 6E can be carried out by using a two step etching process using a first etching medium (i.e., etching gas or liquid) to selectively etch sublayer 231 and then using a second etching medium to selectively etch sublayer 227. Alternatively, one step etching process may be used to etch the via by using an etching medium which etches both sublayers 231 and 227. Thus, the via 207 is located in the first polymer sublayer 227 and the etch stop 231, and the trench is located in the second polymer sublayer 229.

The method of the fourth preferred embodiment is advantageous compared to the method of the third preferred embodiment because the trench etch automatically stops on the etch stop sublayer. Hence, a precise control of the timing of the trench etch of the first embodiment is not required. This provides improved control of the trench depth. Other elements and steps of the fourth preferred embodiment illustrated in FIGS. 6A–F are the same as in the method of the third preferred embodiment shown in FIGS. 5A–F and described above.

Figure 7:
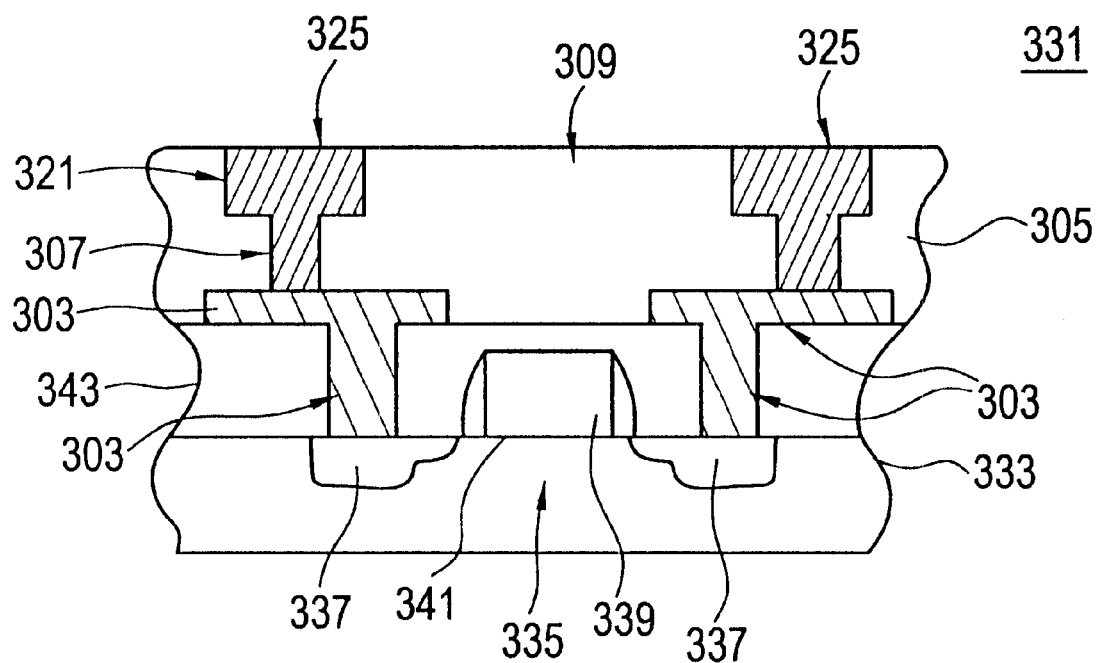
FIG. 7 illustrates a side cross sectional view of a MOSFET containing a dual inlaid via made according to the preferred embodiments of the present invention.

The in process metallization section 101, 201 may be formed as a part of any semiconductor device or other solid state device. FIG. 7 illustrates a portion of a completed semiconductor device 331 containing the dual inlaid vias made by the methods of the preferred embodiments. The semiconductor device 331 contains a substrate 333, which may be a semiconductor (such as silicon or gallium arsenide, etc.), a glass or a plastic material. One or more active elements 335 are formed on the substrate 333. The active element may comprise at least one of a MOSFET, a MESFET, a bipolar transistor, a capacitor, a resistor or any other desired device. For example, FIG. 7 illustrates a MOSFET 335.

The MOSFET 335 contains doped source and drain regions 337 in the substrate 333, a gate electrode 339 with sidewall spacers and a gate dielectric 341 between the gate electrode and the channel region in the substrate 333. At least one insulating layer overlies the active element 335. For example, the at least one insulating layer includes a first level insulating layer 343 and a first intermetal dielectric 305, as illustrated in FIG. 7. It should be understood that there may be other plural intermetal dielectric layers above layer 305 that contain vias. The first conductive layer 303 is formed between the insulating layers 305 and 343. The dual inlaid vias 307/321 are formed in the insulating layer 305 by any of the methods of the preferred embodiments. The second conductive layer 325 is formed to contact the first conductive layer 303 through the dual inlaid vias 307/321. The top surface of the second conductive layer 325 is planar and level with the top surface 309 of the intermetal dielectric 305.

While the invention has been described in detail and with reference to specific embodiments thereof, it will be apparent to one skilled in the art that various changes and modifications can be made therein without departing from the scope of the invention. Thus, the breadth and scope of the present invention should not be limited by any of the above-described exemplary embodiments, but should be defined only in accordance with the following claims and their equivalents.

We claim:

1. A method of making a dual inlaid via in a first layer, comprising:

forming a first opening in the first layer;

forming a bilayer resist comprising an imaging layer above a BARC in the first opening, such that a lower section of the BARC is located in the first opening and an upper section of the BARC extends above the first opening;

selectively exposing the imaging layer to radiation;

patterning the bilayer resist;

forming a second opening in communication with the first opening using the patterned bilayer resist as a mask; and wherein said bilayer resist forming step includes forming the BARC such that said upper section of the BARC extends above the first opening to a first height that is sufficient to substantially prevent exposing radiation from reaching a lower section of the BARC located in the first opening.

2. The method of claim 1, wherein the step of selectively exposing comprises exposing the imaging layer to radiation such that no radiation reaches the lower section of the BARC in the first opening through the upper section of the BARC.

3. The method of claim 2, wherein the BARC extends at least 100 angstroms above a top of the first opening.

4. The method of claim 3, wherein the BARC extends between 700 and 1500 angstroms above the first opening.

5. The method of claim 3, wherein the step of patterning the bilayer resist comprises:

developing and removing an exposed portion of the imaging layer; and etching an exposed portion of the BARC using an unexposed portion of the imaging layer as a mask.

6. The method of claim 5, wherein the imaging layer comprises a polysilane or a polysiloxane polymer and the BARC comprises an organic fluoropolymer.

7. The method of claim 6, wherein the step of forming the first opening comprises:

forming a second resist over the first layer;

forming a third opening in the second resist;

etching the first opening in the first layer through the third opening in the second resist; and removing the second resist.

8. The method of claim 3, wherein the first opening comprises a via having a first width and the second opening comprises a trench having a second width greater than the first width, the trench being located in the first layer directly above the via.

9. The method of claim 8, wherein:

the step of forming the first opening comprises forming the via to a first depth in the first layer;

the step of patterning the bilayer resist comprises removing a first portion of the bilayer resist from an upper surface of the first layer directly adjacent to via sidewall and a second portion of the bilayer resist in the via, while leaving a third portion of the bilayer resist over the upper surface of the first layer distal from the via sidewall; and the step of forming the second opening comprises removing an upper portion of the first layer directly adjacent to the via sidewall using the third portion of the bilayer resist as a mask to form the trench having a second depth less than the first depth, such that a bottom surface of the trench is adjacent to top portions of the via sidewall.

10. The method of claim 8, wherein:

the first layer comprises an insulating layer containing a first polymer sublayer, an etch stop sublayer above the first sublayer and a second polymer sublayer above the etch stop sublayer;

the first and second polymer sublayers have a dielectric constant of 3.7 or less;

the via is located in the first polymer sublayer and the etch stop layer; and the trench is located in the second polymer sublayer.

11. The method of claim 3, wherein the first opening comprises a trench having a first width and the second opening comprises a via having a second width less than the first width, the trench being located in the first layer directly above the via.

12. The method of claim 11, wherein:

the step of forming the first opening comprises forming the trench to a first depth in the first layer;

the step of patterning the bilayer resist comprises removing a first portion of the bilayer resist from a first portion of a bottom surface of the trench, while leaving a second portion of the bilayer resist on a sidewall of the trench; and the step of forming the second opening comprises removing a portion of the first layer directly below the bottom surface of the trench to form the via having a second depth greater than the first depth.

13. The method of claim 3, wherein the first layer comprises an insulating layer having a dielectric constant of 3.7 or less.

14. The method of claim 13, wherein the insulating layer comprises at least one polymer having a formula: $[(HSiO_{1.5})_x O_y]_n$, $(HSiO_{1.5})_n$, $[(HSiO_{1.5})_{x=}O_{y=}(RSiO_{1.5})_z ]_n$, $[(HSiO_{1.5})_{x=}(RSiO_{1.5})_y ]_n$, wherein x=6 to 20, y=1 to 3, z=6 to 20, n=1 to 4,000, and each R is independently H, $C_1$ to $C_8$ alkyl or $C_6$ to $C_{12}$ aryl.

15. The method of claim 14, wherein the insulating layer comprises hydrogensilsesquioxane.

16. The method of claim 13, wherein the insulating layer comprises organic spin-on glass, polysilsequioxane, siloxane parylene, PTFE, polyimide, fluorinated polyimide, benzocyclobutene, fluorinated benzocyclobutene, polyarylene ether or fluorinated polyarylene ether.

17. The method of claim 1, further comprising forming a conductive layer in the first opening.

18. A method of making a semiconductor device containing a dual inlaid via, comprising:

forming a via in a polymer containing insulating layer;

forming a bilayer resist comprising an imaging layer above a BARC in the via, such that a lower section of the BARC is located in said via and an upper section of the BARC extends above the via;

selectively exposing the imaging layer to radiation;

patterning the exposed imaging layer to remove a first portion of the imaging layer above the upper surface of the insulating layer adjacent to via sidewall and a second portion of the imaging layer over the via, while leaving a third portion of the imaging layer over the upper surface of the insulating layer distal from the via sidewall;

removing a first portion of the BARC above the upper surface of the insulating layer adjacent to the via sidewall and a second portion of the BARC in the via, while leaving a third portion of the BARC that is masked by the third portion of the imaging layer on the upper surface of the insulating layer distal from the via sidewall;

etching an exposed upper portion of the insulating layer using the third portion of the imaging layer and the third portion of the BARC as a mask to form a trench having a width greater than that of the via, such that a top of the via is located in a bottom surface of the trench; and wherein said bilayer resist forming step includes forming the BARC such that said upper section of the BARC extends above the via to a first height that is sufficient to substantially prevent exposing radiation from reaching a lower section of the BARC located in the via.

19. The method of claim 18, wherein the BARC extends at least 100 angstroms above a top of the via.

20. The method of claim 19, wherein the lower section of the BARC completely fills the via and the upper section of the BARC extends at least 500 angstroms above the top of the via.

21. The method of claim 20, wherein the upper section of the BARC extends between 700 and 1500 angstroms above the top of the via.

22. The method of claim 21, wherein:

the insulating layer comprises hydrogensilsesquioxane;

the imaging layer comprises a positive polysilane or polysiloxane imaging layer; and the BARC comprises an organic fluoropolymer.

23. The method of claim 22, further comprising:

forming an active element over a substrate;

forming a first conductive layer over the active element;

forming the hydrogensilsesquioxane insulating layer over the first conductive layer;

forming a second resist over the insulating layer;

patterning the second resist;

forming the via through the insulating layer to the first conductive layer using the second resist as a mask;

forming a second conductive layer in the trench such that the second conductive layer contacts the first conductive layer through the via; and planarizing the second conductive layer such that a top surface of the second conductive layer is substantially level with the upper surface of the insulating layer.

24. The method of claim 23, wherein the insulating layer comprises two hydrogensilsesquioxane sublayers separated by an inorganic etch stop sublayer.

25. A method of making a semiconductor device containing a dual damascene contact, comprising:

forming an active element over a substrate;

forming a first conductive layer over the active element;

forming an insulating layer comprising hydrogensilsesquioxane over the first conductive layer;

forming a first resist over the insulating layer;

selectively exposing the first resist to radiation;

patterning the first resist;

etching the insulating layer using the patterned first resist as a mask to form a via extending through the insulating layer to the first conductive layer;

removing the first resist;

forming a bilayer resist comprising an imaging layer above a BARC in the via, such that a lower section of the BARC is located in said via and an upper section of the BARC extends above the via;

selectively exposing the imaging layer to radiation;

patterning the exposed imaging layer to remove a first portion of the imaging layer above the upper surface of the insulating layer adjacent to via sidewall and a second portion of the imaging layer over the via, while leaving a third portion of the imaging layer on the BARC over the upper surface of the insulating layer distal from the via sidewall;

removing a first portion of the BARC above the upper surface of the insulating layer adjacent to the via sidewall and a second portion of the BARC in the via, while leaving a third portion of the BARC that is masked by the third portion of the imaging layer, on the upper surface of the insulating layer distal from the via sidewall;

etching an exposed upper portion of the insulating layer using the third portion of the imaging layer and the third portion of the BARC as a mask to form a trench having a width greater than that of the via, such that a top of the via is located in a bottom surface of the trench;

forming a second conductive layer in the trench such that the second conductive layer contacts the first conductive layer through the via;

planarizing the second conductive layer such that a top surface of the second conductive layer is substantially level with the upper surface of the insulating layer; and wherein said bilayer resist forming step includes forming the BARC such that said upper section of the BARC extends above the via to a first height that is sufficient to substantially prevent exposing radiation from reaching a lower section of the BARC located in the via.

26. The method of claim 25, wherein the insulating layer contains an inorganic etch stop sublayer between two hydrogensilsesquioxane sublayer portions.

27. The method of claim 25, wherein the upper section of the BARC extends at least 100 angstroms above a top of the via.

28. The method of claim 27, wherein the upper section of the BARC extends at least 500 angstroms above the top of the via.

29. The method of claim 28, wherein the upper section of the BARC extends between 700 and 1500 angstroms above the top of the via.

30. The method of claim 25, wherein:

the active element comprises a MOSFET;

the imaging layer comprises a positive polysilane or polysiloxane imaging layer; and the BARC comprises an organic fluoropolymer.

* * * * *